(12) United States Patent
Abiprojo et al.

(10) Patent No.: US 8,336,352 B2
(45) Date of Patent: Dec. 25, 2012

(54) TRANSIENT DETECTOR AND FAULT CLASSIFIER FOR A POWER DISTRIBUTION SYSTEM

(75) Inventors: Priotomo Abiprojo, O'Fallon, MO (US); Gordon Gregg, St. Louis, MO (US); David Rieken, St. Peters, MO (US)

(73) Assignee: Aclara Power-Line Systems, Inc., Hazelwood, MO (US)

( * ) Notice: Subject to any disclaimer, the term of this patent is extended or adjusted under 35 U.S.C. 154(b) by 398 days.

(21) Appl. No.: 12/692,919

(22) Filed: Jan. 25, 2010

(65) Prior Publication Data

US 2011/0184671 A1 Jul. 28, 2011

(51) Int. Cl.
*G06F 11/30* (2006.01)
*G06F 17/40* (2006.01)
*G06F 19/00* (2011.01)
*G01R 31/08* (2006.01)

(52) U.S. Cl. .......... 72/69; 73/865.8; 324/72; 324/76.38; 324/102; 340/659; 702/58; 702/182; 702/183; 702/187; 702/189; 708/105; 708/200

(58) Field of Classification Search .......... 73/432.1, 73/865.8, 866.3; 324/72, 76.11, 76.12, 76.38, 324/102; 340/500, 540, 635, 657, 659, 660, 340/664, 870.01, 870.07; 702/1, 57, 58, 702/64, 65, 66, 69, 127, 182, 183, 187, 189; 708/100, 105, 131, 160, 200

See application file for complete search history.

(56) References Cited

U.S. PATENT DOCUMENTS

| 2,737,646 | A | * | 3/1956 | Muffly .......................... 340/318 |
| 3,973,240 | A |   | 8/1976 | Fong |
| 3,986,115 | A | * | 10/1976 | Huang .......................... 324/102 |
| 4,107,778 | A | * | 8/1978 | Nii et al. ........................ 702/59 |
| 4,110,684 | A | * | 8/1978 | Gale ............................ 324/522 |
| 4,351,011 | A | * | 9/1982 | Liberman ...................... 361/82 |
| 5,181,026 | A |   | 1/1993 | Granville |
| 5,475,556 | A | * | 12/1995 | Yoon et al. ..................... 361/87 |
| 5,537,327 | A | * | 7/1996 | Snow et al. ................... 700/293 |
| 5,550,476 | A | * | 8/1996 | Lau et al. ...................... 324/522 |
| 5,602,709 | A | * | 2/1997 | Al-Dabbagh ................... 361/85 |

(Continued)

FOREIGN PATENT DOCUMENTS

JP 3-251022 A * 11/1991

*Primary Examiner* — Edward Cosimano
(74) *Attorney, Agent, or Firm* — Polster, Lieder, Woodruff & Lucchesi, L.C.

(57) ABSTRACT

Detection of fault occurrences within a power distribution system. A transient detector and fault classification system (10) implements an algorithm that detects transients which may result from the occurrence of a fault in the power distribution system. The system includes a detection module (18) which processes a set samples obtained from electrical waveforms propagated of through the power distribution system and appear to be statistically anomalous compared to other sample data. This is done using an adaptive detection algorithm that is applied when large changes occur in a waveform over a relatively short period of time. The identified samples are then provided to a signal classifier module (20) which processes sets of samples to classify a transient they represent as a likely fault occurrence or some other type of anomaly which is likely not a fault occurrence. If a transient is classified as representing a likely fault occurrence, a polling module (30) polls users of the distribution system to determine if a fault has occurred within the distribution system, and, if so, where.

15 Claims, 3 Drawing Sheets

U.S. PATENT DOCUMENTS

| | | | |
|---|---|---|---|
| 5,734,575 A * | 3/1998 | Snow et al. | 700/286 |
| 5,856,776 A | 1/1999 | Armstrong et al. | |
| 6,360,178 B1 * | 3/2002 | Parsons et al. | 702/65 |
| 6,459,998 B1 * | 10/2002 | Hoffman | 702/62 |
| 6,496,342 B1 | 12/2002 | Horvath et al. | |
| 6,772,075 B2 * | 8/2004 | Parsons et al. | 702/65 |
| 6,822,457 B2 | 11/2004 | Borchert et al. | |
| 6,885,674 B2 | 4/2005 | Hunt et al. | |
| 6,996,483 B2 * | 2/2006 | Parsons et al. | 702/65 |
| 7,174,261 B2 | 2/2007 | Gunn et al. | |
| 7,180,412 B2 | 2/2007 | Bonicatto et al. | |
| 7,274,305 B1 | 9/2007 | Luttrell | |
| 7,342,507 B2 | 3/2008 | Jonker et al. | |
| 7,400,150 B2 | 7/2008 | Cannon | |
| 7,496,430 B2 * | 2/2009 | Mak | 700/292 |
| 7,738,612 B2 | 6/2010 | Rafaeli | |
| 7,742,393 B2 | 6/2010 | Bonicatto et al. | |
| 2002/0072867 A1 * | 6/2002 | Parsons et al. | 702/59 |
| 2004/0164743 A1 * | 8/2004 | Parsons et al. | 324/522 |
| 2007/0211401 A1 * | 9/2007 | Mak | 361/119 |

* cited by examiner

TRANSIENT DETECTOR AND FAULT CLASSIFIER FOR A POWER DISTRIBUTION SYSTEM

CROSS-REFERENCE TO RELATED APPLICATIONS

Not applicable.

STATEMENT REGARDING FEDERALLY SPONSORED RESEARCH

Not applicable.

BACKGROUND OF THE INVENTION

This invention relates to the detection of fault occurrences in electrical or power distribution systems; and, more particularly, to a detector which first detects waveform transients which may be indicative of a fault occurring somewhere in the system, and then classifies the result of the detection as a likely fault occurrence or some other type of anomaly which is likely not a fault.

In an electrical distribution system, energy in the form of a 60 Hz waveform (50 Hz in some locales) is transmitted over the power lines of the system. These waveforms exhibit a wide variety of transient conditions which are continuously occurring. Many of these transients result from such routine things as a power switch being closed or opened to turn a piece of equipment "on" or "off", or when the operating speed of a motor is changed. The characteristics of such transients, their duration, peaks, rise and fall times, degradation rate, etc., are generally known.

When a fault occurs somewhere in the system, a transient also results. Since faults often result in power outages, it is important for the utility to be able to timely detect their occurrence and the area over which the outage extends. The utility can then rapidly respond to correct the outage and restore service to the affected area. Otherwise, if the utility waits until a customer calls to report an outage, it means the customer has already been inconvenienced.

Fault detection schemes are known in the art. See, for example, U.S. Pat. No. 7,496,430 which is assigned to the same assignee as the present invention. The present invention, however, provides a quick and efficient method of recognizing and classifying faults so to enable a utility to timely identify outages and respond to them.

BRIEF SUMMARY OF THE INVENTION

The present disclosure is directed to a method for detecting the occurrence of faults in a power distribution system. An algorithm processes information obtained for transients occurring in waveforms which are monitored at a power distribution substation. The transients typically are indicative of the occurrence of a fault in the distribution network, and their timely detection leads to improved detection of power outages in the system.

The algorithm, which is fully implemented in software, includes a detector (receiver) module and a signal classification module. The detector module receives and processes the power-line waveform, and produces discrete, real-time samples of the waveform which are inspected to look for statistically anomalous patterns against a background of recent waveform data. Anomalous patterns include transients which occur during faults, but may also be transients which result from line load switching and regular load fluctuations caused, for example, by operation of a motor. The classifier module then distinguishes between fault-induced transients and the other transients. This is done by the classification module examining the anomalous pattern to identify a plurality of characteristics or properties commonly associated with fault transients as opposed to the other transients.

The detector module executes a detection algorithm that down samples a waveform to a predetermined frequency (120 Hz) so to substantially reduce computational complexity. The detector module further executes an adaptive detection algorithm that triggers when large changes occur in the samples over a relatively short period of time, i.e., the detection of transients. The classification module then determines whether or not a transient represents the signature of a fault occurrence based upon certain unique features found in the sample and associated with a fault signature.

The method of the invention is a passive method whose implementation provides quick and accurate classification of a transient as representative of a fault signature or the signature of some other type transient within the utility's power distribution system, and does so without imposing any additional burden on the system.

Other objects and features will be in part apparent and in part pointed out hereinafter.

The foregoing and other objects, features, and advantages of the invention as well as presently preferred embodiments thereof will become more apparent from the reading of the following description in connection with the accompanying drawings.

BRIEF DESCRIPTION OF THE SEVERAL VIEWS OF THE DRAWINGS

The objects of the invention are achieved as set forth in the illustrative embodiments shown in the drawings which form a part of the specification.

Corresponding reference characters indicate corresponding parts throughout the several views of the drawings.

DESCRIPTION OF THE PREFERRED EMBODIMENT

Figure 1:
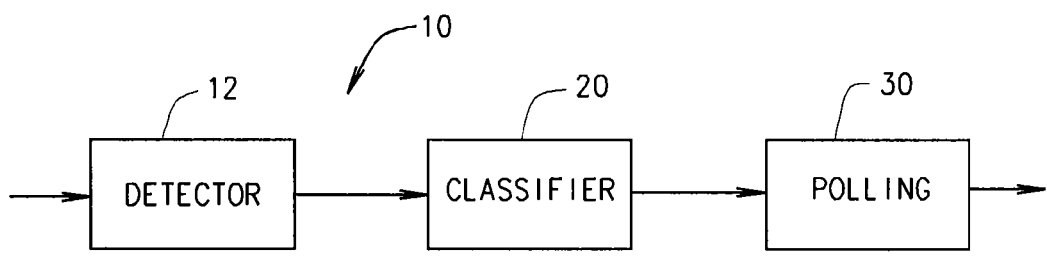
FIG. 1 is a functional diagram of a fault detection and classification system of the present invention.

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

Referring to FIG. 1, a transient detection and fault classification system of the present invention is indicated generally 10. System 10, as described hereinafter, comprises three modules; a detector module 12, a classifier module 20, and a polling module 30. The purpose of system 10 is to first detect the occurrence of a transient and then based upon pre-established criteria to classify the transient as likely or not likely to represent the signature of a fault that can cause a power outage within a power distribution system. System 10 further functions to particularly classify transients representing faults which cause protective devices installed within the power distribution system to operate and to poll users on portions of the distribution system to determine the extent of any outage.

Figure 2:
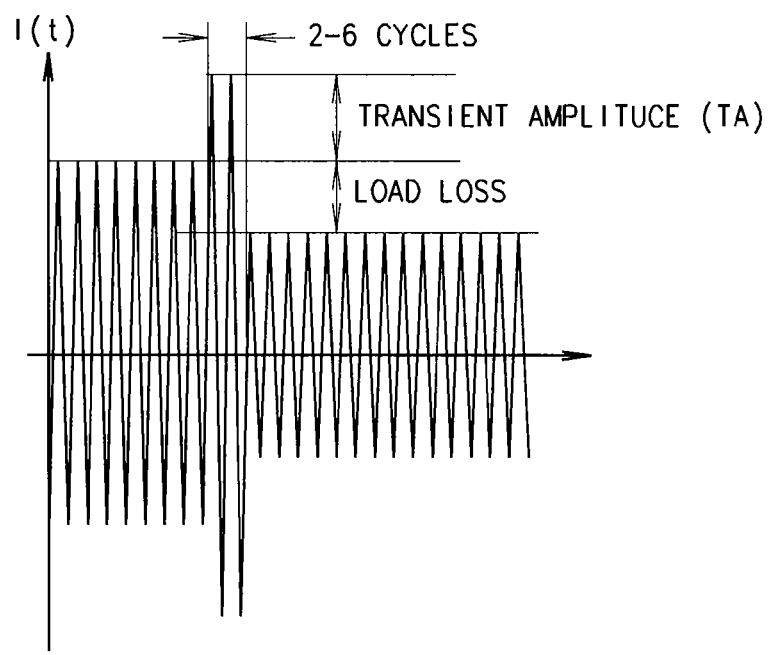
FIG. 2 is a representation of the characteristics a signature of a fault inducing transient on a power line.

The method of the invention implemented by system 10 comprises a three stage approach to fault detection. In a first stage, the current waveform being monitored at the distribution substation is sampled by detector module 12 and the samples are processed to detect any statistical anomalies, i.e., transients, which may indicate a fault. Samples meeting pre-established criteria in this regard are forwarded to the second stage. At this stage, the samples are examined by signal classification (classifier) module 20 to determine if the characteristics of a transient they represent resemble a fault signature such as shown in FIG. 2. If they do, then at the third stage, polling module 30 utilizes a power line communications system used by the utility to poll meters on the feeder phase(s) in question. Responses to the polling are used to finally determine both if an outage has occurred within the distribution system, and, if so, where.

System 10 operates by first examining the current on each feeder phase at a substation of the distribution system to detect any outage-inducing transient. The characteristics of a typical fault signature are shown in FIG. 2. In FIG. 2, a feeder current I(t) exhibits a classic outage-inducing transient. The amplitude of the transient, indicated TA in the figure, represents a substantial increase in a load somewhere in the system. The magnitude of transient TA depends on several factors including, for example, the cause of the fault. This can be lightning, an animal coming into contact with a feeder line and now acting as a conductor, a tree branch blown or falling onto the power line, or a short circuit within the system. It will be understood by those skilled in the art that faults occurring on the low side of a service transformer will have a lower current amplitude than similar faults occurring on the high side of the transformer.

The increased current of transient TA will flow through the affected portion of the power distribution system until one or more protective devices of the utility interrupts the circuit. The typical time for this to occur is from 2 to 6 cycles of the 60 Hz waveform propagated through the power distribution system (approximately 0.03-0.1 seconds). Operation of the protective device(s) ends the transient current; but, it also shuts off power to all of the utility's customers downstream from the protective device. This causes a loss in the load imposed on the system from what it was prior to occurrence of the transient. It will be understood by those skilled in the art that the magnitude of this loss is a function of the load imposed on the system by users of the system at the time of the fault. Accordingly, the impact will vary from circuit to circuit, location on a given circuit, and with time of day.

A number of factors are considered in formulating the algorithms used in detector portion 12 and classifier portion 20 of system 10. One is a nearly constant change in current on a feeder as the result of an almost constant change in the load on a monitored circuit imposed by the utility's customers using that circuit. In this regard, small changes appear as low-intensity random events that vary widely over short periods of time. Large switching events are more troublesome to take into account. This is because, for example, the switching "on" of a large load to the system can result in a transient whose characteristics appear very similar to those which occur when a fault happens. For example, large motor switching often produces a transient having characteristics similar to those affected when a fault occurs.

Figure 3:
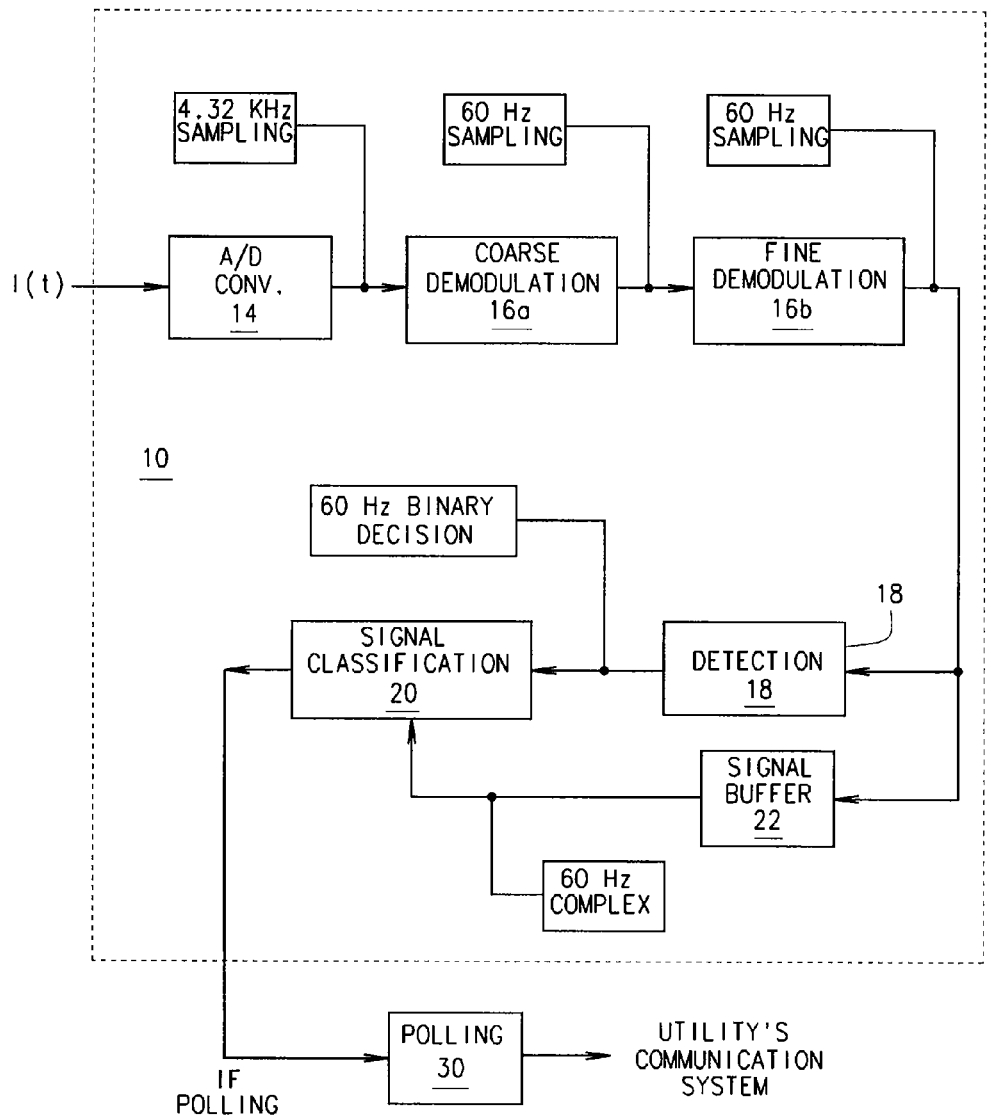
FIG. 3 is a more-detailed block diagram representation of the detection system.

Referring to FIG. 3, a fault detection algorithm used by the method of the present invention is shown in block diagram form. In exercising the algorithm, an analog signal representing the feeder phase current I(t) is first converted to a digital signal using an analog-to-digital (A/D) converter 14. In converter 14, signal I(t) is sampled at a rate of, for example, 4320 Hz to produce the resulting digital signal.

The digital output signal from converter 14 is supplied to a demodulator module which, using a two stage demodulation process, produces a 60 Hz complex-valued signal. In the first stage 16a, a coarse demodulation is performed; while, in a second stage 16b, a fine demodulation is performed. In module 16a, a complex current waveform is translated into a baseband signal. In module 16b, small deviations in the carrier frequency of the baseband signal, which cannot be accounted for in module 16a, are estimated and then removed from the baseband signal. The resultant signal output from module 16b is then supplied to a detection module 18 and to a signal buffer 22.

Module 18 examines samples of the signal for statistical changes that could possibly be indicative of a fault. When such a change is detected, module 18 provides an input to classifier module 20. In response, module 20 examines the most recent set of data stored in signal buffer 22, as well as incoming samples, and determines if the signal pattern resembles the signal shown in FIG. 2. When the signal classifier finds such a signal an alert is provided to an upstream system to initiate a polling process.

For signal classification, the method of the invention incorporated into the algorithm employs a technique in which certain features are extracted and then used for fault classification. For each suspected fault event, a predetermined number of samples are provided to signal classification module 20 via buffer 22. The samples represent complex value data obtained at a rate of 60 samples per second. Ninety-one (91) samples are used, for example, these corresponding to baseband information of the power line signal. The total number of samples includes 1 current sample, 30 previously obtained samples, and 60 incoming samples. Exemplary samples analyzed by signal classification module 20 are shown in FIGS. 4A and 4B in which FIG. 4A represents the magnitude of an upward transient occurring within the power distribution system, and FIG. 4B the phase of the transient.

Figure 4A:
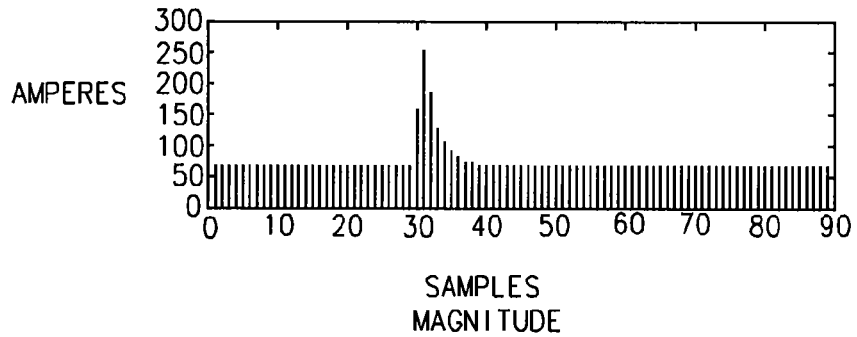
FIG. 4A represents the magnitude of an upward transient occurring within the power distribution system, and FIG. 4B the phase of the transient.
Figure 4B:
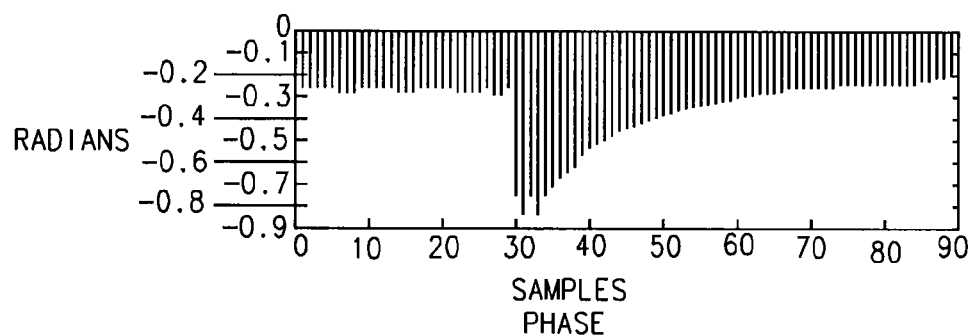

A sample set such as shown in FIGS. 4A and 4B is provided to signal classification module 20 through buffer 22. The function of module 20 is, as noted, to determine if this sample set represents a fault event. Studies suggest that there are three distinguishing features found in the magnitude of the samples representing a transient in a baseband sample set that can be used to classify the samples as representing a fault signal so it can be classified as such.

Figure 5:
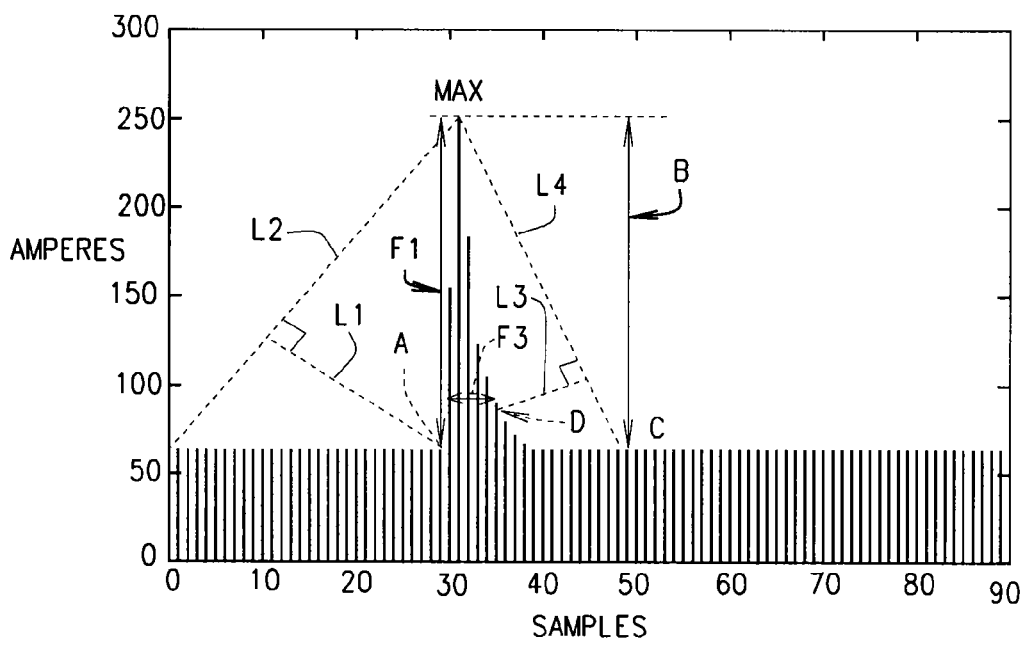
FIG. 5 is similar to FIG. 4A but with an analysis performed on the sample to determine if the transient shown therein has the signature of a fault condition.

First, before computing feature parameters of the sample set, module 20 determines whether any transient appearing in the sample set is an upward or downward transient. As an example, FIG. 5 illustrates the same sample set as shown in FIG. 4A. In this sample set, the transient is shown as represented by the $31^{st}$ to the $40^{th}$ samples. A measurement F1 represents the height of the transient and is the greatest magnitude of those samples between from the $31^{st}$ and the $40^{th}$ sample. The $31^{st}$ sample is selected because it is the sample that triggers detection module 18. The $40^{th}$ sample is selected because the peak of the fault transient is assumed to have occurred before this sample.

Referring to FIG. 5, a magnitude is determined for a sample (Point A) taken prior to the start or beginning of the transient. This Point A is the sample having the longest distance L1 to a line L2 extending between the magnitude of the first sample in the sample set and the maximum value max shown in FIG. 5.

Next, a value F2 is determined. This value represents the measure of how much current amplitude drops after the transient occurs. The value F2 is expressed as a percentage and is defined as the ratio between B and F1, where B represents the distance from the maximum value of the transient (i.e., the height of the tallest sample between the $31^{st}$ and $40^{th}$ samples) to a point C which represents a minimum point between the sample with the maximum value and the $50^{th}$ sample. The $50^{th}$ sample is selected based on the assumption that the transient of a fault subsides before the $50^{th}$ sample. Field tests have shown that, in fault events, the current amplitude after the transient does not necessarily drop to a level lower than that of the current before the transient. Therefore, value F2 can be less than 100% and the maximum value of F2 is "capped" at 100%.

Third, a value F3 is determined. This value represents a measure of the transient's width (duration of the transient) and is defined as the number of samples between the point A and a point D shown in FIG. 5. Point A, as noted, represents the beginning of the transient. Point D represents the end of the transient and is the sample that has the longest distance L3 to a line L4 connecting the maximum value max to the $50^{th}$ sample. Again, the $50^{th}$ sample is used because of the assumption that the transient of a fault subsides before the $50^{th}$ sample. With respect to the lines L1 and L3 used to determine points A and D, it will be noted that, as shown in FIG. 5, these lines extend perpendicular to the lines L2, L4 they respectively intersect.

The features described and discussed above have been used to process data obtained in field tests of the system. A detector (not shown) was used to monitor 6 feeders, with 24 conductors (3 phases plus a neutral for each feeder). The detector had a detection threshold of 16 amps. When a suspected fault event occurred on any conductor, the detector captured data for all 24 conductors, it being understood by those skilled in the art that a single fault event may yield transients on different phases. Of 4220 events reported during one of these tests, 14 events were actually reported faults.

Table 1 shows the values F1-F3 for the reported faults.

| F1 (AMP) | F2(%) | F3 (samples) |
|---|---|---|
| 48.04 | 100 | 6 |
| 443.68 | 100 | 7 |
| 222.05 | 94.47 | 9 |
| 54.76 | 100 | 5 |
| 90.17 | 98.63 | 4 |
| 266.49 | 100 | 10 |
| 189.96 | 100 | 6 |
| 152.58 | 99.67 | 6 |
| 58.89 | 100 | 4 |
| 215.52 | 87.59 | 5 |
| 39.90 | 100 | 4 |
| 386.85 | 100 | 5 |
| 73.74 | 100 | 4 |

-continued

| F1 (AMP) | F2(%) | F3 (samples) |
|---|---|---|
| 91.94 | 100 | 5 |
| 244.42 | 100 | 7 |

From the data in Table 1, the worst case values of the respective features are:
F1=39.90 A, F2=87.59%, and F3=10 samples.
Using this information, decision parameters are derived by setting limits on the values of the respective features.

Referring to Table 2, a concern in setting the limits is the rate at which false alarms may occur. If one set of limits is used, the false alarm rate may differ significantly for the same data than when a different set of limits is used. Table 2 illustrates the false alarm rate for separate limits on F1-F3.

TABLE 2

False-alarms vs. decision surface parameters (100% detection)

| F1(Amp) | F2(%) | F3 (samples) | False Alarms (35 days, 6 feeders) | False Alarm Rate (events per day per feeder) |
|---|---|---|---|---|
| >16 (detector's threshold) | >80 | <11 | 33 | 0.1571 |
| >20 | >80 | <11 | 15 | 0.0714 |
| >25 | >80 | <11 | 12 | 0.0571 |
| >30 | >80 | <11 | 11 | 0.0524 |
| >16 | >70 | <11 | 47 | 0.2238 |
| >16 | >60 | <11 | 54 | 0.2571 |
| >16 | >80 | <13 | 376 | 1.7905 |
| >16 | >80 | <15 | 646 | 3.0762 |

The purpose of system 10 and the algorithm it implements is to correctly classify every fault that causes medium voltage protective devices within the utility's power distribution system to operate, at the expense of having a "reasonable" level of false alarms. Studies have shown that a solid fault causes a significant change in the amplitude of power-line signals. By properly classifying the characteristics of actual faults, the classification algorithm appropriately utilizes the information contained in a baseband sample set.

Further, it will be appreciated that in any fault detection system, there is the possibility that some events will be mistaken for the occurrence of a fault and result in a "false alarm". However, excessive false alarms reported by such a system ultimately will undermine a utility's confidence in the detection system being used with the result that alarms caused by the occurrence of real faults will tend to be ignored. False alarm rates can be reduced by reducing the sensitivity of the detection system, but this has the drawback that some actual faults will go undetected. Accordingly, there is trade-off between the rate of false alarms produced by the detection system and rate of actual alarms detected by the detection system. What this means is that the algorithms employed by system 10 must provide an acceptable (to the utility) balance between false and actual alarm rates so to provide a) adequate detection reliability; while, b) keeping waste of system resources due to false alarms (e.g., polling time) to an acceptable level.

Using data obtained from the tests it has been found that for a relatively large value of the F1 threshold (F1>25 amps), the variations in the F2 and F3 thresholds do not significantly affect the number for false alarms. However, variations in the F1 and F3 thresholds significantly affect the number of missed classifications. This suggests that for a relatively large threshold value of F1, the thresholds of F2 and F3 can be "loosely" set so to minimize the number of missed classifications without substantially increasing the number of false alarms. For example, if F1 has the large threshold noted above (>25 amps), it has been found that loose F2 and F3 thresholds (e.g., F2>87%, F3<12 samples) should be used to minimize the number of missed classifications. Then, for low F1 thresholds (<25 amps), tightening the F2 and F3 thresholds (i.e., increasing the F2 threshold or decreasing the F3 threshold) can significantly reduce the number of false alarms.

Overall, the function of the pattern classifier is to implement decision rules regarding the selection among possible class patterns. This is achieved by first developing an understanding of the discriminating factors between classes and is based upon a combination of observations of the field data, and an understanding of each class' behavior. The attribute values for each class are determined as a result of the data acquired during testing and evaluation of this data.

Next, the method of the invention includes an additional classifier algorithm implemented within module 20 which can classify a transient pattern to be a feeder-switch event rather than a fault. When such a pattern is detected, system 10 provides an output to the utility or upstream system that the distribution network may have been reconfigured. Also, besides classification of fault and feeder-switching events, system 10 can also implement other classification algorithms depending a utility's particular needs or wants so to promote the most efficient delivery of electrical power throughout the utility's distribution system.

In view of the above, it will be seen that the several objects and advantages of the present disclosure have been achieved and other advantageous results have been obtained.

Having thus described the invention, what is claimed and desired to be secured by Letters Patent is:

1. In an electrical power distribution system, a method for detecting the occurrence of a fault comprising:
   monitoring waveforms on the distribution system;
   sampling the current of the waveforms and processing the samples obtained to detect any anomalies which may indicate a fault has occurred within the distribution system, the processing including detecting any transients within a set of waveform samples by identifying anomalous samples contained within the set relative to a statistical pattern of recent waveform samples; and,
   classifying samples meeting pre-established criteria indicative of a fault to then classify the result of a sampling as representing a likely fault occurrence or some other type of anomaly which is likely not a fault occurrence, the classification including comparing transients against a predetermined set of criteria to determine which transients result from faults rather than from other events within the distribution system, and features used for classifying a transient as a fault including identifying a peak current magnitude of those samples within a transient and measuring how much the magnitude of the current changes between the peak magnitude and the resulting magnitude after the transient has settled.

2. The method of claim 1 in which the sampling includes sampling the current on each feeder phase of the distribution system at a distribution substation of the system.

3. The method of claim 1 in which set of samples includes a current sample, at least one previously obtained sample, and at least one incoming sample.

4. The method of claim 1 further including classifying an anomaly as a feeder-switch event rather than a fault.

5. The method of claim 1 in which if a sample is classified as representing a likely fault occurrence, polling users of the distribution system to determine if a fault has occurred within the distribution system, and, if so, where.

6. The method of claim 1 in which the features used for classifying a transient as a fault further include the duration of the transient.

7. The method of claim 6 in which the method further includes establishing a classification for whether or not a transient represents an actual fault based upon selected values for each of the classifying features.

8. A transient detector and classification system for analyzing transients occurring in waveforms propagated through a power distribution system to determine if a transient is indicative of a fault somewhere in the system that may result in a power outage comprising:
   a detection means monitoring the waveforms and obtaining continuous samples of the waveforms;
   processor means processing the samples to determine if a transient occurred that may represent the signature of a fault occurrence, the processing means detecting any transients within the waveform samples by identifying anomalous samples relative to a statistical pattern of recent waveform samples; and,
   a classifier evaluating a set of samples representing the transient in accordance with predetermined criteria to classify the transient as representing a likely fault occurrence or some other type of anomaly which is likely not a fault occurrence, the classifier comparing each transient against a predetermined set of criteria to determine which transients result from faults rather than transients resulting from other events within the distribution system, the classifier classifying a transient as a fault based upon identifying a peak current magnitude of those samples within the transient and by a measure of how much the magnitude of the current changes between the peak magnitude and the resulting magnitude after the transient has settled.

9. The system of claim 8 in which the detection means samples the current of waveforms on each feeder phase of the distribution system at the distribution substation of the system.

10. The classifier of claim 8 in which the classifier further classifies a transient as a fault further based upon the duration of the transient.

11. The system of claim 8 in which the classifier further classifies an anomaly as a feeder-switch event rather than a fault.

12. A transient detector and classification system for analyzing transients occurring in waveforms propagated through a power distribution system comprising:
   a detector means monitoring waveforms for each feeder phase of the power distribution system, at a distribution substation of the system, and obtaining samples of transients appearing within the waveforms to produce a set of samples of a transient;
   a processor means processing the samples to determine if a transient has occurred that may represent the signature of a fault occurrence, the processing means detecting any transients within the waveform samples by identifying anomalous samples relative to a statistical pattern of recent waveform samples; and,
   a signal classifier evaluating each set of samples to classify a transient as one resulting from normal occurrences within the distribution system or one resulting from an anomaly occurring within the distribution system, the classifier performing its classification based upon preselected features exhibited by the samples contained within the set of samples including comparing each transient against a predetermined set of criteria to determine which transients result from faults rather than transients resulting from other events within the distribution system, and the utility performing an action based upon the result of the classification if the classification indicates the transient resulted from an anomalous occurrence.

13. The system of claim 12 in which if the classifier classifies the transient as indicative of a fault, at least a portion of the power distribution system is polled to determine if the fault resulted in an outage; and, if so, the extent thereof.

14. The system of claim 12 in which if the classifier classifies the transient as indicative of a feeder-switch event, a message is given to the utility that a certain portion of their power distribution network may have been reconfigured.

15. A transient detector and classification system for analyzing transients occurring in waveforms propagated through a power distribution system comprising:
   a detector means monitoring waveforms for each feeder phase of the power distribution system, at a distribution substation of the system, and obtaining samples of transients appearing within the waveforms to produce a set of samples of a transient;
   a signal classifier evaluating each set of samples to classify a transient as one resulting from normal occurrences within the distribution system or one resulting from an anomaly occurring within the distribution system, the classifier performing its classification based upon preselected features exhibited by the samples contained within the set of samples, and the utility performing an action based upon the result of the classification if the classification indicates the transient resulted from an anomalous occurrence; and,
   if the classifier classifies the transient as indicative of a fault, at least a portion of the power distribution system is polled to determine if the fault resulted in an outage; and, if so, the extent thereof.

\* \* \* \* \*